United States Patent [19]

Uda

[11] Patent Number: 5,894,171
[45] Date of Patent: Apr. 13, 1999

[54] SEMICONDUCTOR INTEGRATED CIRCUIT HAVING A GROUNDING TERMINAL

[75] Inventor: Nobuya Uda, Itami, Japan

[73] Assignee: Mitsubishi Denki Kabushiki Kaisha, Tokyo, Japan

[21] Appl. No.: 08/344,624

[22] Filed: Nov. 17, 1994

Related U.S. Application Data

[63] Continuation of application No. 08/025,462, Mar. 3, 1993, abandoned.

[30] Foreign Application Priority Data

Mar. 5, 1992 [JP] Japan ............................ 4-048170

[51] Int. Cl.⁶ ................................................. H01L 23/48
[52] U.S. Cl. .......................... 257/784; 257/666; 257/668; 257/690; 257/691

[58] Field of Search ....................... 257/666, 668, 257/690, 691, 692, 693, 784

[56] References Cited

U.S. PATENT DOCUMENTS

| | | | |
|---|---|---|---|
| 4,982,268 | 1/1991 | Schuermann | 257/666 |
| 5,057,805 | 10/1991 | Kadowaki | 257/666 |
| 5,281,849 | 1/1994 | Singh Deo et al. | 257/666 |

*Primary Examiner*—Carl Whitehead, Jr.
*Attorney, Agent, or Firm*—McDermott, Will & Emery

[57] ABSTRACT

A semiconductor integrated circuit comprising a terminal connected to the ground potential between an input and an output terminal of an oscillator so that a ground wire pattern of sufficient width is provided between the input and output terminals on the wiring substrate.

11 Claims, 9 Drawing Sheets

SEMICONDUCTOR INTEGRATED CIRCUIT HAVING A GROUNDING TERMINAL

This application is a continuation of application Ser. No. 08/025,462 filed Mar. 3, 1993, now abandoned.

BACKGROUND OF THE INVENTION

1. Field of the Invention

This invention relates to a semiconductor chip with a circuit connected to an oscillator to generate clocks, and a semiconductor integrated circuit with the semiconductor chip sealed in a package.

2. Description of the Related Art

In a semiconductor integrated circuit including a circuit to generate an oscillating wave by means of connecting an oscillator outside between an input and an output terminals, it is known to be effective for lightening the hindrance in oscillation such as an parasitic oscillation or the like to shorten the wiring length as much as possible between the oscillator and the semiconductor integrated circuit, and to ground or shield the vicinity of the input and the output terminals by a ground earth wire of low impedance disposed between the terminals. However, the input and the output terminals to the oscillator are provided too close to each other in a conventional semiconductor integrated circuit.

FIG. 1 is a partial plan view showing the periphery of an oscillating circuit of a conventional semiconductor integrated circuit. In the figure, a numeral 1 denotes a semiconductor chip 1 which has an input electrode 4 for inputting an oscillating waveform from an oscillator 8a and an output electrode 6 for supplying a voltage to oscillate the oscillator 8a. The semiconductor chip 1 is fixed to a frame 3 of the ground potential and sealed in a package 2. The package 2 has an input terminal 5 and an output terminal 7 to be respectively connected with the input electrode 4 and the output electrode 6 of the semiconductor chip 1 via metallic wires.

An output and an input terminal of the two-terminal oscillator 8a are connected via capacitors 9, 9 for reducing harmonic noises in the oscillating waveform to the corresponding input terminal 5 and output terminal 7 of the package 2 by wire patterns formed on a wiring substrate 12. A ground wire pattern 14 to shield between the input terminals and output terminals is formed between the above wire patterns for connecting the input and the output terminals 5 and 7 with the input and the output terminals of the oscillator 8a.

FIG. 2 is a partial plan view showing the periphery of an oscillating circuit of a conventional semiconductor integrated circuit to which a three-terminal oscillator with a capacitor incorporated is connected. In the drawing, references 10 and 8b represent a semiconductor integrated circuit and a three-terminal oscillator, respectively. Generally, the central terminal of the oscillator 8b is a connecting terminal to the ground potential, and the output and the input terminals located on both sides of the connecting terminal are connected to the input and the output terminals 5 and 7, respectively of the semiconductor integrated circuit.

In the conventional semiconductor integrated circuits in the above-described structure, the wire pattern on the wiring substrate is inevitably bent in the vicinity of the oscillator, thus causing the wiring length to be elongated and to increase the wiring area, since the input and the output terminals are arranged adjacent to each other, and moreover, since the interval of the terminals becomes narrower according to the recent trend of higher integration of the circuit.

Further, although it is generally ideal that the ground wire has a low impedance, the wiring width of the ground wire pattern 14 is too narrow to obtain enough ground effect because the space between the input and the output terminals 5 and 7 is narrow. At the same time, the narrow space hinders ground within the package between the input and the output terminals 5 and 7.

If an ground wire is provided between the input and the output terminals 5 and 7 of the semiconductor integrated circuit connected with a three-terminal oscillator, the ground effect cannot be expected so much as above due to the narrow wiring width. In this case, therefore, the central ground terminal of the oscillator is connected to a wire of the ground potential pulled from the other surface or from the other wiring layer of the wiring substrate. Further, the oscillator is necessary to be separated by a predetermined distance from the semiconductor integrated circuit in order to wire between the input terminal and the output terminal of the oscillator and the semiconductor integrated circuit in a manner not to overlap the ground terminal of the oscillator. As a result, the wiring length becomes longer thereby to increase the wiring area.

SUMMARY OF THE INVENTION

This invention has been devised to solve the above-described disadvantages and has for its object to provide a semiconductor integrated circuit with a ground potential terminal able to connect to the ground potential located between an output and an input terminal for an oscillator, thereby to accomplish ground also inside a package, in order to prevent the oscillation hindrance such as parasitic oscillation or the like and to reduce the wiring area between the package and the oscillator.

A further object of this invention is to provide a semiconductor chip with a ground potential electrode able to connect to the ground potential located between an output electrode and an input electrode for an oscillator, thereby to shield between the output and the input electrodes to prevent the oscillation hindrance obstruction such as parasitic oscillation or the like.

The above and further objects and features of the invention will more fully be apparent from the following detailed description with accompanying drawings.

DESCRIPTION OF THE PREFERRED EMBODIMENTS

This invention will be discussed hereinafter taken in conjunction with preferred embodiments thereof with reference to the accompanying drawings.

(Embodiment 1)

Figure 1:
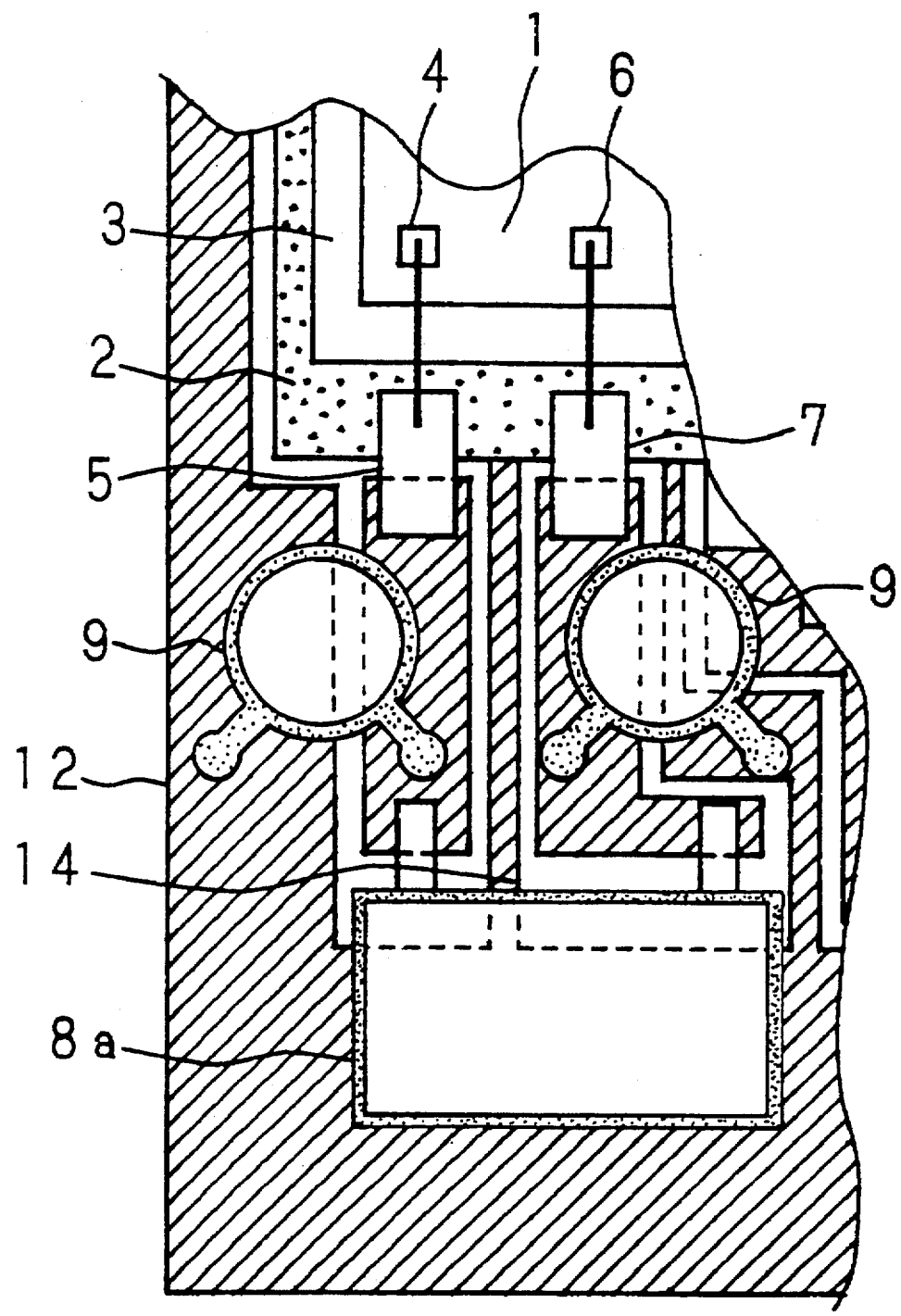
FIG. 1 is a partial plan view of the periphery of an oscillating circuit of a conventional semiconductor integrated circuit.
Figure 2:
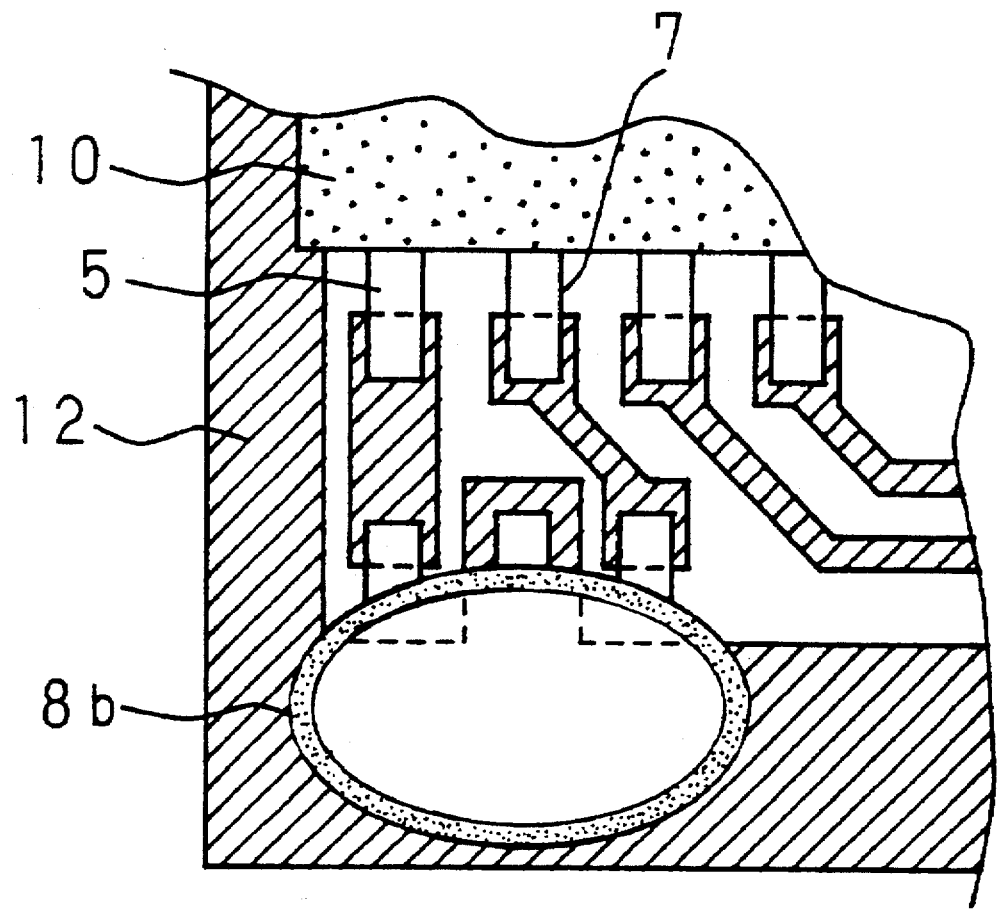
FIG. 2 is a partial plan view of the periphery of an oscillating circuit of a conventional semiconductor integrated circuit with a three-terminal oscillator connected.
Figure 3A:
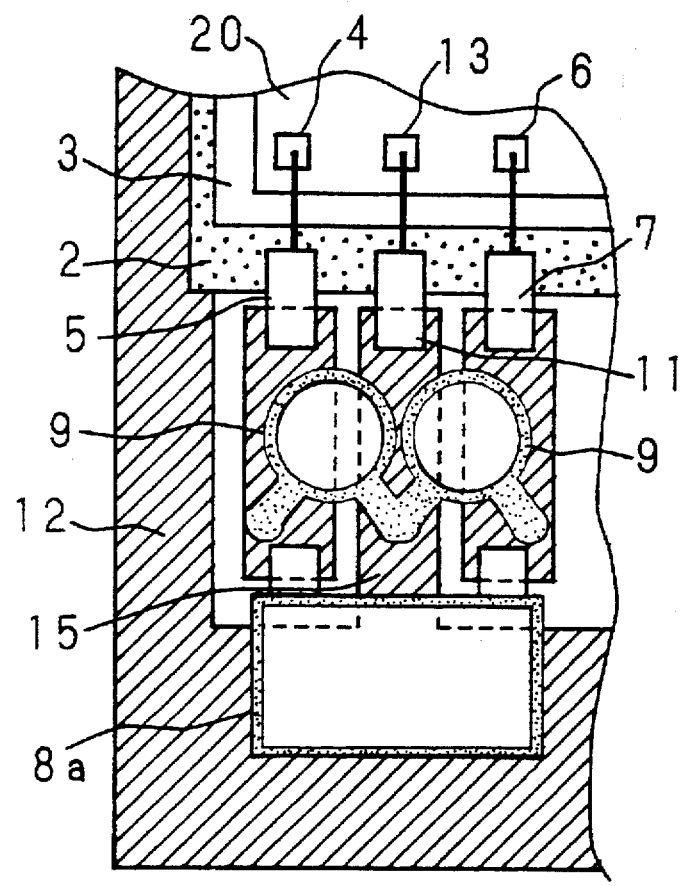
FIG. 3(a) is a partial plan view of the periphery of an oscillating circuit of a semiconductor integrated circuit according to a first embodiment of this invention.
Figure 3B:
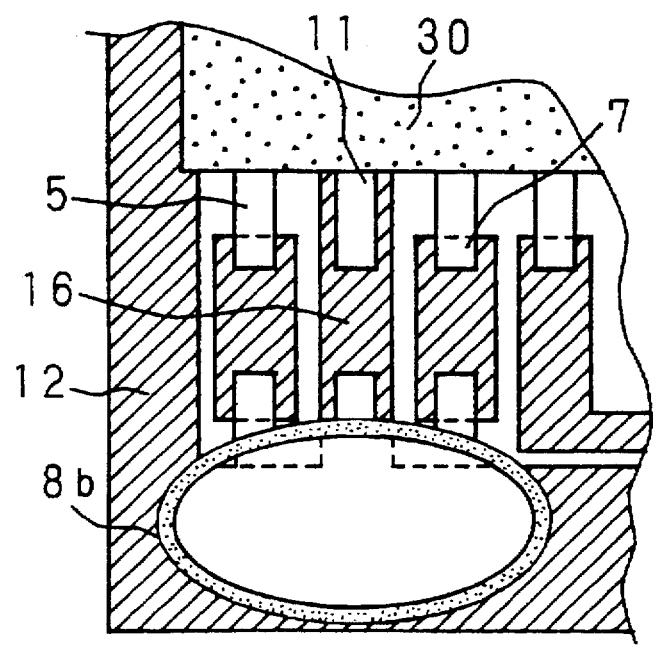
FIG. 3(b) is a partial plan view of the periphery of an oscillating circuit of a semiconductor integrated circuit according to a first embodiment of this invention.

FIG. 3 is a partial plan view of the periphery of an oscillating circuit of a semiconductor integrated circuit (referred to as a circuit of this invention) according to a first embodiment. FIG. 3(a) indicates the circuit of this invention to which a two-terminal oscillator is connected thereto via capacitances. FIG. 3(b) shows the circuit of this invention to which a three-terminal oscillator having an incorporated capacitance is connected. The same parts as the conventional semiconductor integrated circuit are denoted by the same reference numerals, and the description of which will be abbreviated here.

In FIG. 3(a) and FIG. 3(b), a ground potential terminal 11 provided between an input terminal 5 and an output terminal 7 is connected to ground wire patterns 15, 16, respectively on a wiring substrate 12. Meanwhile, a ground potential electrode 13 provided between an input electrode 4 and an output electrode 6 on the semiconductor chip 20 is wired inside a semiconductor chip 20. The ground potential terminal 11 and the ground potential electrode 13 are connected by a metallic wire. Even when either of the oscillators 8a, 8b is to be connected to the circuit of this invention, the ground wire patterns 15, 16 can be formed with a sufficient width.

It is unnecessary to bend the wire pattern between the oscillator 8a or 8b and the semiconductor integrated circuit 30 since the interval between the input and the output terminals 5 and 7 of a semiconductor integrated circuit 30 is approximately equal to that of the input and the output terminals of the oscillator 8a or 8b. At the same time, the wiring area is reduced since the oscillator 8a or 8b can be arranged closer to the semiconductor integrated circuit 30.

The circuit of the invention in the instant embodiment is grounded between the input electrode 4 and the input terminal 5 or between the output electrode 6 and the output terminal 7 up to the vicinity of a semiconductor chip 20, since the ground potential terminal 11 is connected to the ground wire pattern 15 or 16 on the wiring substrate 12, and the ground potential electrode 13 is connected to the ground potential terminal 11 on the package 2 by a metallic wire as shown in FIG. 3(a), whereby even the inside of the package 2 is shield to prevent the parasitic oscillation of the oscillating circuit.

Although, according to the above first embodiment, the ground potential electrode 13 of the semiconductor chip 20 is wired within the semiconductor chip 20, the same effect is achieved as in the first embodiment by an electrode 13 of a type able to electrically connect the ground potential so long as it is connected to the ground potential terminal 11 via the metallic wire.

(Embodiment 2)

Figure 4:
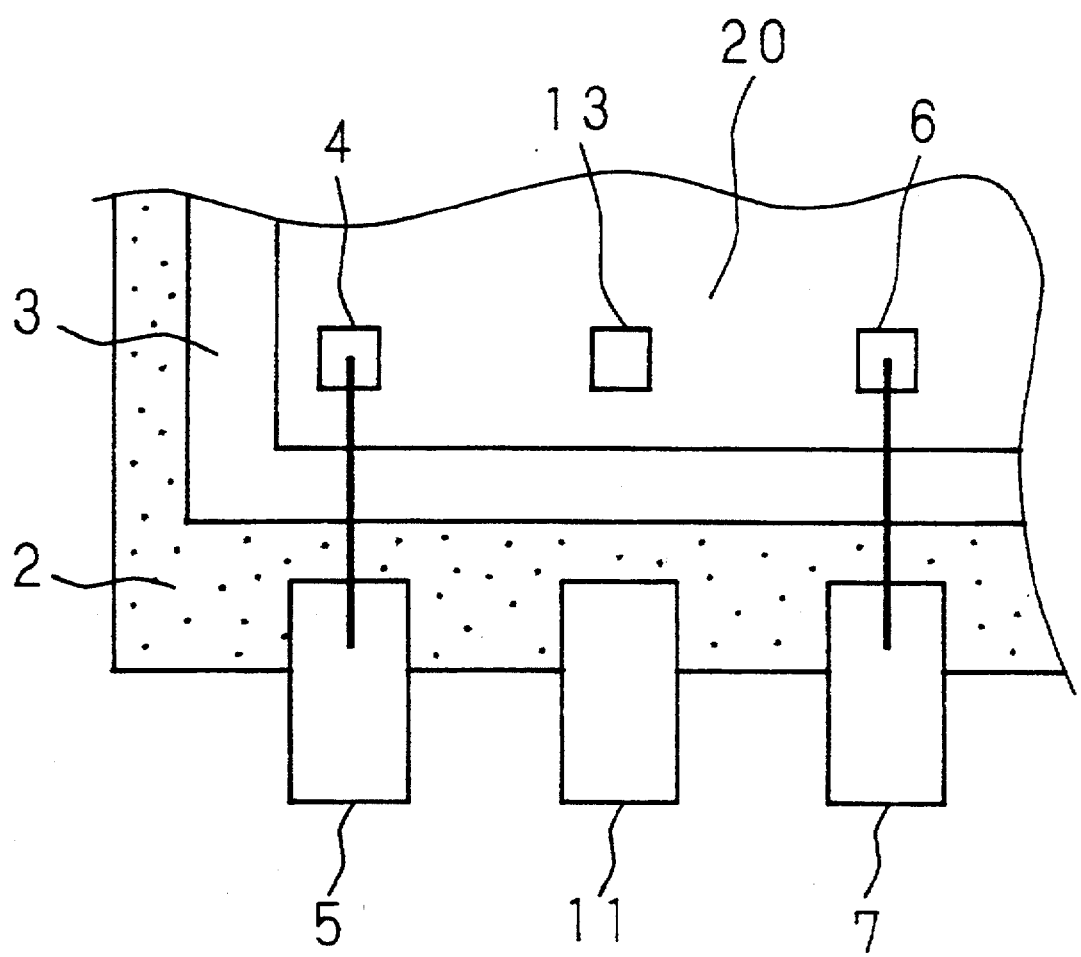
FIG. 4 is a partial plan view of the periphery of an oscillating circuit of a semiconductor integrated circuit according to a second embodiment of this invention.

FIG. 4 indicates a partial plan view of the periphery of an oscillating circuit of a circuit of this invention according to a second embodiment. In the second embodiment, the ground potential electrode 13 of the semiconductor chip 20 is not connected with the ground potential terminal 11 of the package 20. As is understood from this embodiment, it is not necessary to connect the ground potential electrode 13 with the ground potential terminal 11 if the practical shielding effect is not harmed.

(Embodiment 3)

Figure 5:
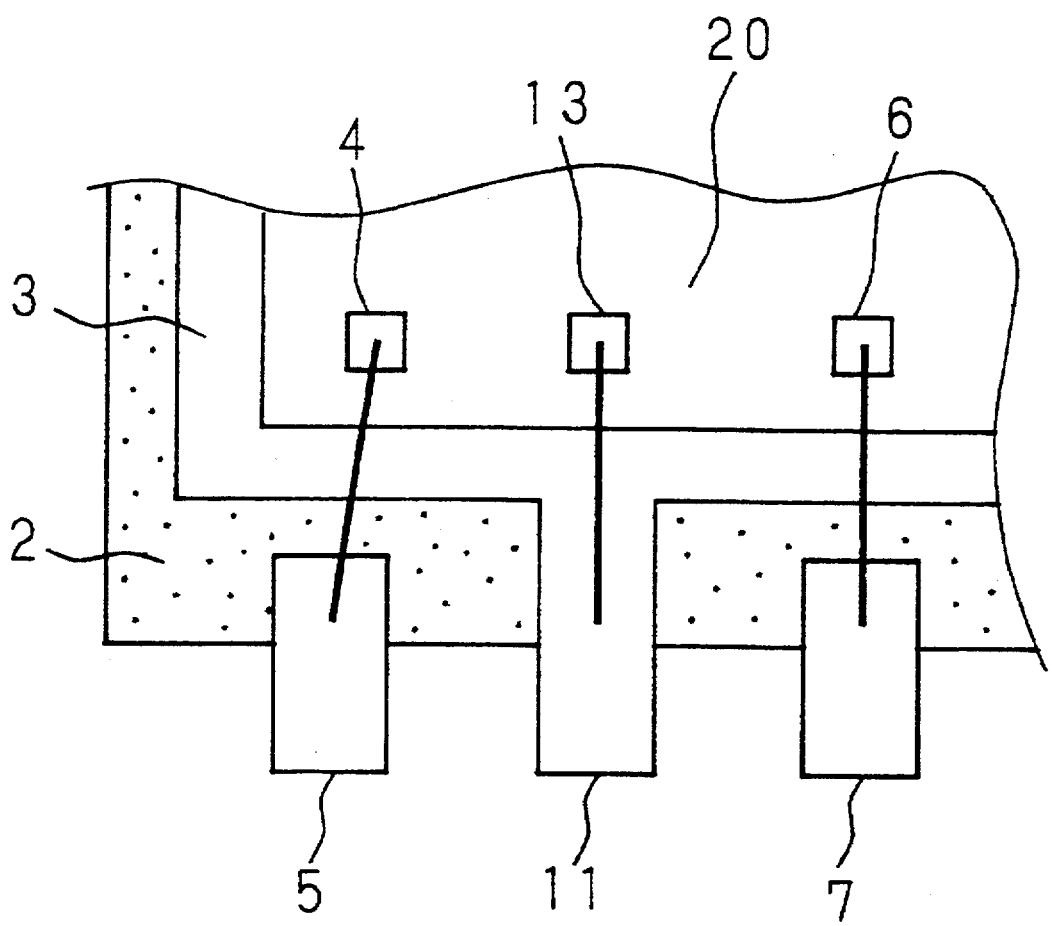
FIG. 5 is a partial plan view of the periphery of an oscillating circuit of a semiconductor integrated circuit according to a third embodiment of this invention.

FIG. 5 illustrates a partial plan view of the periphery of an oscillating circuit of a circuit of this invention in a third embodiment. In FIG. 5, the ground potential terminal 11 is formed of a metallic terminal by extending a part of a frame 3 of the ground potential between the input and the output terminals 5 and 7 to the outside of the package 2. The ground potential electrode 13 is connected with this ground potential terminal 11 by a metallic wire.

Although the ground potential electrode 13 is connected with the ground potential terminal 11 by the metallic wire as described above in the third embodiment, the both are unnecessary to be connected with each other if the ground potential electrode 13 is fixed to the ground potential inside the integrated circuit 30 or is not particularly necessary to be connected by the metallic wire.

(Embodiment 4)

Figure 6:
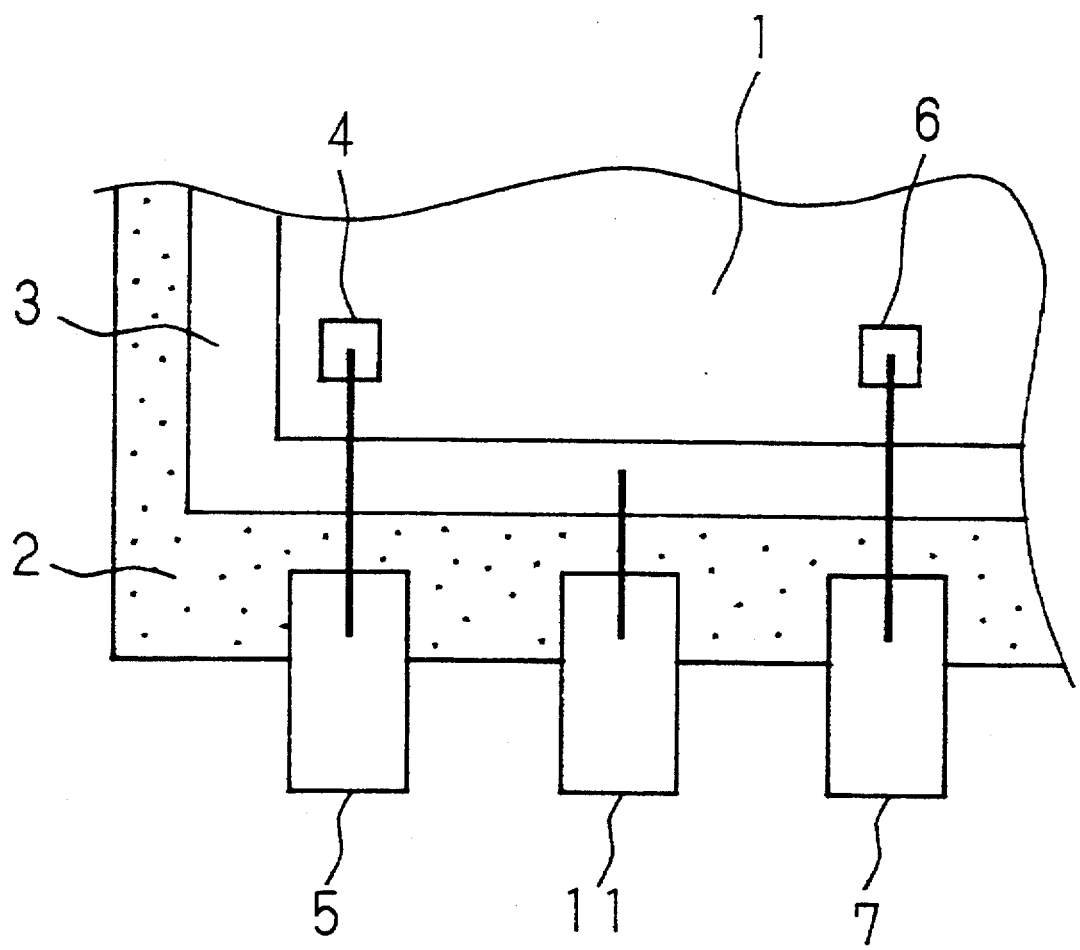
FIG. 6 is a partial plan view of the periphery of an oscillating circuit of a semiconductor integrated circuit according to a fourth embodiment of this invention.

FIG. 6 is a partial plan view showing the periphery of an oscillating circuit of a circuit of this invention according to a fourth embodiment. In this embodiment, a semiconductor chip 1 without the ground potential electrode 13 is sealed in the package 2 having the ground potential terminal 11. According to the fourth embodiment, the ground potential terminal 11 of the package 2 may be connected by a metallic wire with the frame 3 of ground potential which supports the semiconductor chip 1.

(Embodiment 5)

Figure 7:
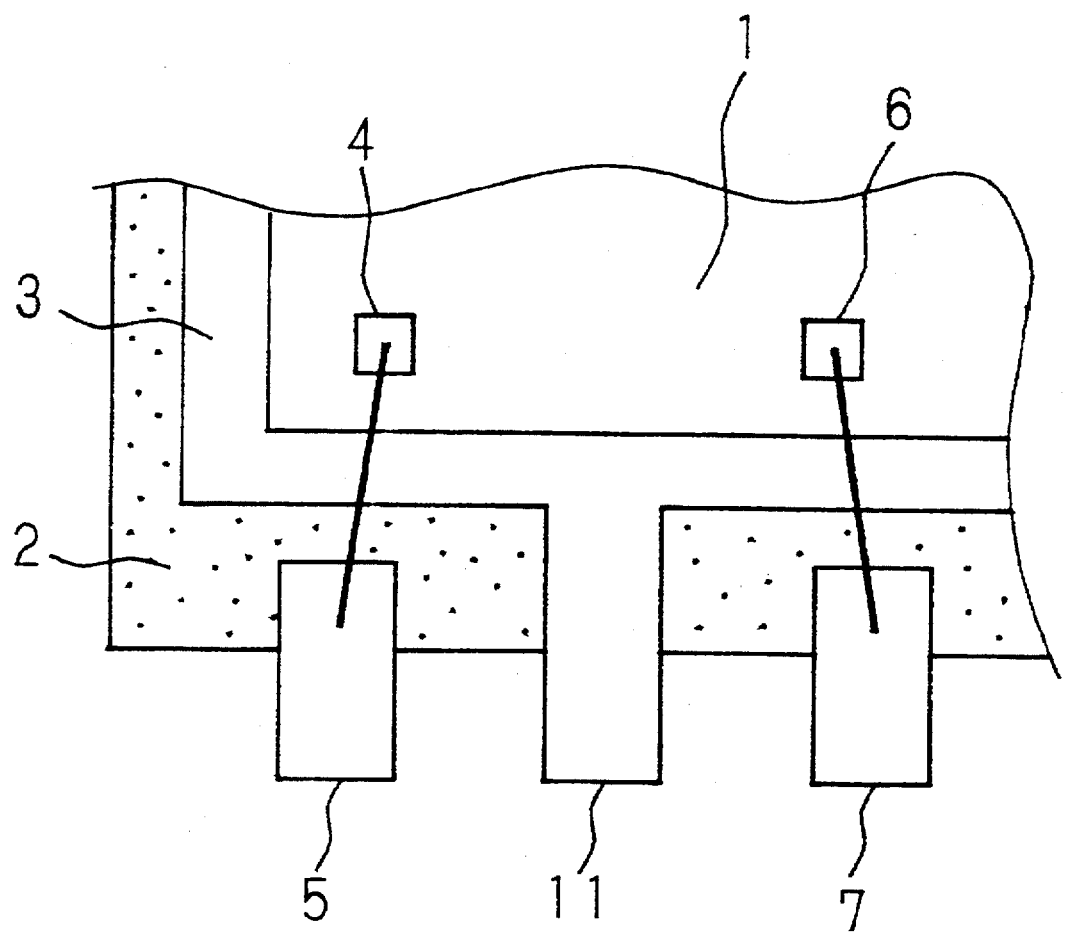
FIG. 7 is a partial plan view of the periphery of an oscillating circuit of a semiconductor integrated circuit according to a fifth embodiment of this invention.

FIG. 7 is a partial plan view indicating the periphery of an oscillating circuit of a circuit of this invention according to a fifth embodiment. In the instant embodiment, the semiconductor chip 1 without the ground potential electrode 13 is sealed in a package 2 with an ground potential terminal 11 formed by a part of the frame 3 being extended to the outside of the package 2. Accordingly, between the input and the output terminals 5 and 7 up to the inside of the package 2 is shielded owing to the ground potential terminal 11.

(Embodiment 6)

Figure 8:
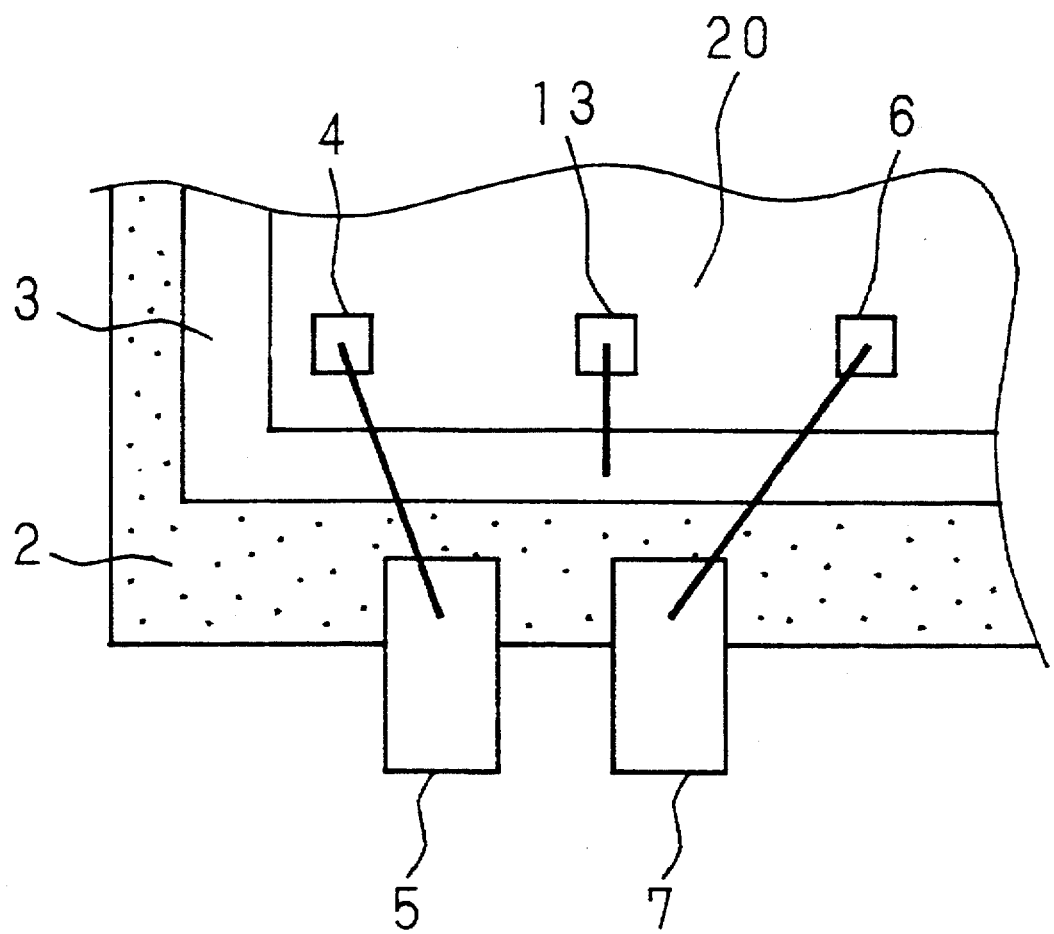
FIG. 8 is a partial plan view of the periphery of an oscillating circuit of a semiconductor integrated circuit according to a sixth embodiment of this invention.

FIG. 8 shows a partial plan view of the periphery of an oscillating circuit of a circuit of this invention according to a sixth embodiment. In this embodiment, the semiconductor chip 20 having the ground potential electrode 13 is sealed in the package 2 without the ground potential terminal 11. Accordingly, between the input and the output electrodes 4 and 6 of the semiconductor chip 20 is possibly grounded by means of connecting the ground potential electrode 13 of the semiconductor chip 20 with the frame 3 of the ground potential.

(Embodiment 7)

Figure 9:
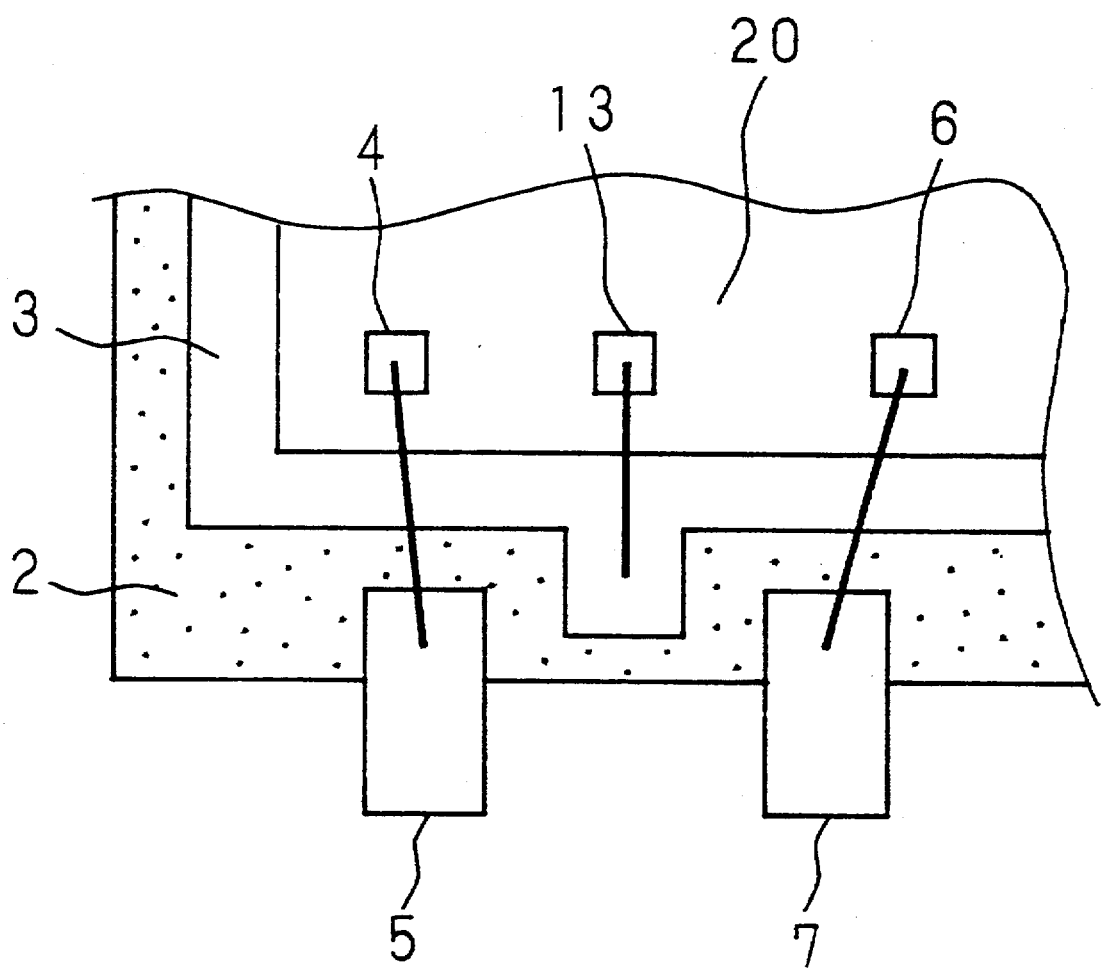
FIG. 9 is a partial plan view of the periphery of an oscillating circuit of a semiconductor integrated circuit according to a seventh embodiment of this invention.

FIG. 9 is a partial plan view of the periphery of an oscillating circuit of a circuit of this invention according to a seventh embodiment. In the seventh embodiment, a part of the frame 3 of the ground potential is extended between the input and the output terminals 5 and 7 of the package 2, to which the ground potential electrode 13 is connected by a metallic wire. Different from the foregoing third and fifth embodiments, the frame 3 is not extended to the outside of the package 2. Between the input and the output terminals 5 and 7 of the package 2 is then grounded owing to the extended part.

Although, in the seventh embodiment, the ground potential electrode 13 is connected with the extended part of the frame 3 as above, they might not be connected with each other if the ground potential electrode 13 is fixed to the ground potential within the integrated circuit 30 or it is unnecessary to connect the both of them by the metallic wire..

Moreover, although the semiconductor chip 1 or 20 is rigidly supported and secured by the frame 3 in the foregoing embodiments, the semiconductor chip may be fixed by a metallic plate provided with the package. In this case, the metallic plate works as the frame 3.

Further, the positions of the input and the output electrodes of the semiconductor chip or the input and the output terminals of the package may be reversed.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A semiconductor integrated circuit with a semiconductor chip fixed on a metallic plate of ground potential and sealed in a package, which has an output terminal and an input terminal connected to an oscillator, said package comprising:

a ground potential terminal provided between said oscillator input and output terminals and extending from the metallic plate, wherein said oscillator input and output terminals do not extend from the metallic plate.

2. A semiconductor integrated circuit according to claim 1, wherein an ground potential terminal is formed by extending said metallic plate outside of the package between said output terminal and input terminal.

3. A semiconductor chip fixed on a lead frame and having an output electrode and an input electrode connected to an oscillator, comprising:

a ground potential electrode extending from the lead frame between said oscillator output electrode and input electrode, wherein said oscillator input and output electrodes do not extend from the lead frame.

4. A semiconductor integrated circuit according to claim 3 fixed to the metallic plate of the ground potential is sealed in said package.

5. A semiconductor integrated circuit according to claim 4, wherein said output electrode, input electrode and ground potential electrode are connected to said output terminal, input terminal and ground potential terminal, respectively.

6. A semiconductor integrated circuit according to claim 4, wherein an ground potential terminal is formed by extending a part of said metallic plate outside of the package between said output and input terminals.

7. A semiconductor integrated circuit according to claim 6, wherein said output electrode, input electrode and ground potential electrode are connected to said output terminal, input terminal and ground potential terminal, respectively.

8. A semiconductor integrated circuit according to claim 1, wherein an output electrode, an input electrode and said ground potential terminal are connected to said output terminal, input terminal and metallic plate, respectively.

9. A semiconductor integrated circuit with the semiconductor chip according to claim 3 fixed to a metallic plate ground potential and sealed in a package, which has an output terminal and an input terminal for an oscillator, characterized by that said ground potential electrode is connected to said metallic plate by electrically conductive material.

10. A semiconductor integrated circuit with the semiconductor chip according to claim 3 fixed to a metallic plate ground potential and sealed in a package, which has an output terminal and an input terminal for an oscillator, said metallic plate comprising:

an extended part between said output terminal and input terminal within said package.

11. A semiconductor integrated circuit according to claim 10, wherein the ground potential electrode is connected to the extended part of said metallic plate.

* * * * *